United States Patent
Guo et al.

(10) Patent No.: US 9,466,480 B2
(45) Date of Patent: Oct. 11, 2016

(54) CLEANING PROCESS FOR OXIDE

(71) Applicant: UNITED MICROELECTRONICS CORP., Hsin-Chu (TW)

(72) Inventors: Ted Ming-Lang Guo, Tainan (TW); Chin-Cheng Chien, Tainan (TW); Chueh-Yang Liu, Tainan (TW); Neng-Hui Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 10 days.

(21) Appl. No.: 14/532,015

(22) Filed: Nov. 4, 2014

(65) Prior Publication Data
US 2016/0126091 A1 May 5, 2016

(51) Int. Cl.
*H01L 21/8242* (2006.01)
*H01L 21/02* (2006.01)
*H01L 21/311* (2006.01)

(52) U.S. Cl.
CPC ..... *H01L 21/02334* (2013.01); *H01L 21/0206* (2013.01); *H01L 21/02181* (2013.01); *H01L 21/02307* (2013.01); *H01L 21/31111* (2013.01); *H01L 21/31144* (2013.01)

(58) Field of Classification Search
CPC ............... H01L 21/02334; H01L 21/31144; H01L 21/311; H01L 21/31111; H01L 21/02318
See application file for complete search history.

(56) References Cited

U.S. PATENT DOCUMENTS

| | | | |
|---|---|---|---|
| 6,403,425 B1 | 6/2002 | Ang | |
| 6,723,581 B1 | 4/2004 | Chabal | |
| 2004/0198000 A1 | 10/2004 | Chen | |
| 2004/0253780 A1 | 12/2004 | Cho | |
| 2005/0191800 A1 | 9/2005 | Wu | |
| 2006/0281265 A1 | 12/2006 | Burnham | |
| 2007/0015372 A1* | 1/2007 | Yoon ................ | H01L 21/32134 438/745 |
| 2011/0272736 A1* | 11/2011 | Lee ................ | H01L 21/823412 257/183 |
| 2014/0024186 A1* | 1/2014 | Yoo ................ | H01L 21/28211 438/275 |

* cited by examiner

*Primary Examiner* — Thanh Y Tran
(74) *Attorney, Agent, or Firm* — Winston Hsu; Scott Margo

(57) ABSTRACT

A cleaning process for oxide includes the following step. A substrate having a first area and a second area is provided. A first oxide layer is formed on the substrate of the first area and the second area. An ammonium hydroxide ($NH_4OH$) and hydrogen peroxide ($H_2O_2$) containing process is performed on the first oxide layer of the first area and the second area. A photoresist layer covers the first oxide layer of the first area while exposing the first oxide layer of the second area. The first oxide layer of the second area is removed. The photoresist layer is then removed.

20 Claims, 4 Drawing Sheets

CLEANING PROCESS FOR OXIDE

BACKGROUND OF THE INVENTION

1. Field of the Invention

The present invention relates generally to a cleaning process for oxide, and more specifically to a cleaning process performed on a gate oxide in an input/output area as well as a core area.

2. Description of the Prior Art

With advances in semiconductor technology, integrated circuits (IC') that have multi-functional circuit modules composed of a large number of transistors and/or other semiconductor devices integrated on a silicon die have become ever more popular. In integrated circuits of VLSI and ULSI, the number of transistors and/or other semiconductor devices included is huge and the devices are densely packed together. Therefore, there are isolation structures between adjacent transistors/devices to prevent short circuits from occurring. The most commonly used isolation structures may include field oxide isolation, and trench isolation such as shallow trench isolation (STI). When the line width of the semiconductor device falls to below 0.25 µm, isolating devices using a field oxide layer becomes infeasible and trench isolation becomes the only means of device isolation.

Moreover, in an integrated circuit, different circuit modules and/or transistors and other devices in the same chip may operate in different voltage regimes. In an integrated switching-mode power supply, which may include a power transistor and a control circuit for switching the power transistor ON and OFF to convert a supply voltage into a desired output voltage, the power transistor may have an operating voltage much higher than an operating voltage of transistors constituting the control circuit. In order to have an area-efficient high voltage device with low voltage control devices fabricated on a same die, gate insulation layers with different thicknesses are required. When the high-voltage driving elements and the low-voltage driving elements are embodied simultaneously, a thick gate oxide film for high voltage and a thin gate oxide film for low voltage are required.

SUMMARY OF THE INVENTION

The present invention provides a cleaning process for oxide, which performs a heavy clean process such as an ammonium hydroxide ($NH_4OH$) and hydrogen peroxide ($H_2O_2$) containing process with a relatively higher processing temperature and longer processing time on a thick oxide layer in both high-voltage and low-voltage areas to improve the performance of one area while maintaining that of the other area.

The present invention provides a cleaning process for oxide which includes the following steps. A substrate having a first area and a second area is provided. A first oxide layer is formed on the substrate of the first area and the second area. An ammonium hydroxide ($NH_4OH$) and hydrogen peroxide ($H_2O_2$) containing process is performed on the first oxide layer of the first area and the second area. A photoresist layer covers the first oxide layer of the first area while exposing the first oxide layer of the second area. The first oxide layer of the second area is removed. The photoresist layer is then removed.

According to the above, the cleaning process for oxide performs the ammonium hydroxide ($NH_4OH$) and hydrogen peroxide ($H_2O_2$) containing process on the first oxide layer of the second area as well as the first area; that is, before covering the photoresist layer. Hence, the interface of the first oxide layer in the first area and a later formed dielectric layer that has a high dielectric constant is improved due to Si—O—Si bonds of the first oxide layer in the first area being broken and transforming into Si—OH bonds. This leads to better intermixing of the first oxide layer and the dielectric layer having a high dielectric constant and low current leakage density ($J_g$). Negative bias temperature instability (NBTI) and electrical mobility of a later formed component such as a transistor in the second area can be maintained because the substrate and a later formed second oxide layer in the second area are not damaged or structurally changed by the ammonium hydroxide ($NH_4OH$) and hydrogen peroxide ($H_2O_2$) containing process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
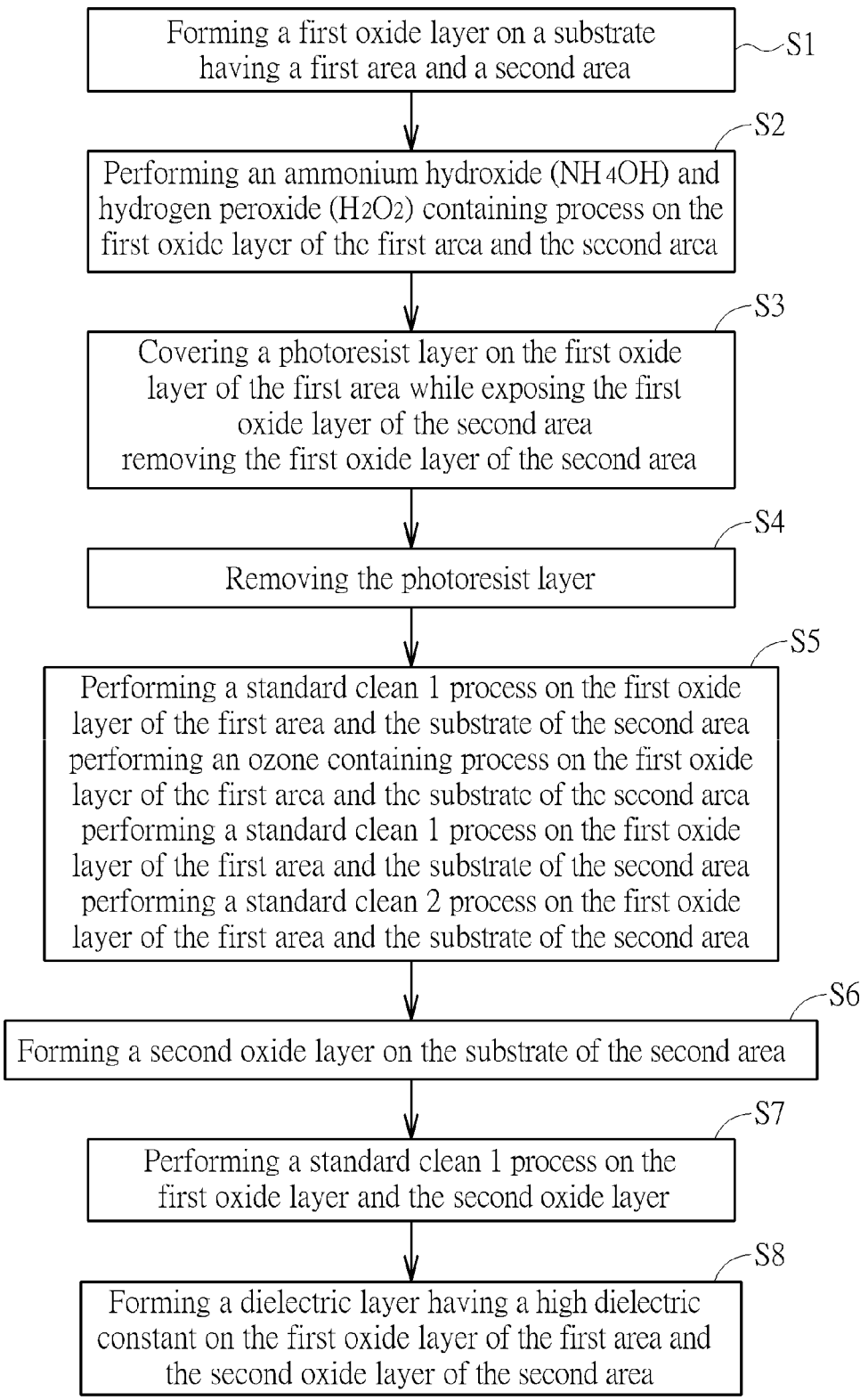
FIG. 1 schematically depicts a flow chart of a cleaning process for an oxide according to an embodiment of the present invention.

FIG. 1 schematically depicts a flow chart of a cleaning process for oxide according to an embodiment of the present invention. FIGS. 2-8 schematically depict a cross-sectional view of a cleaning process for the oxide of FIG. 1.

Figure 2:
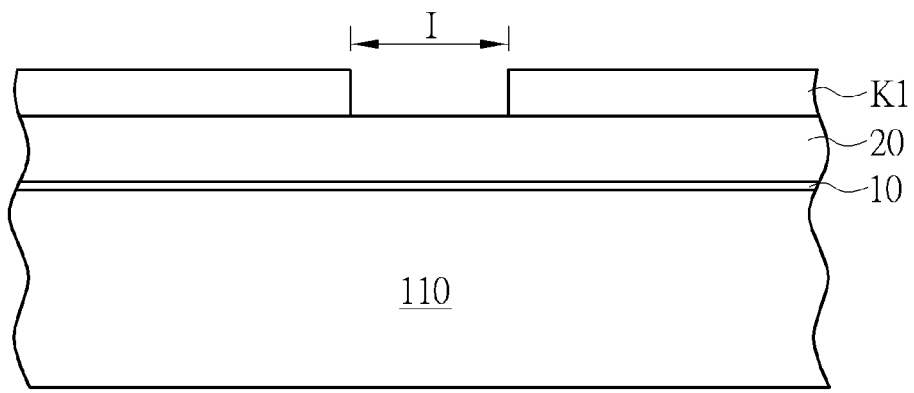
FIGS. 2-8 schematically depict a cross-sectional view of a cleaning process for the oxide of FIG. 1.
Figure 3:
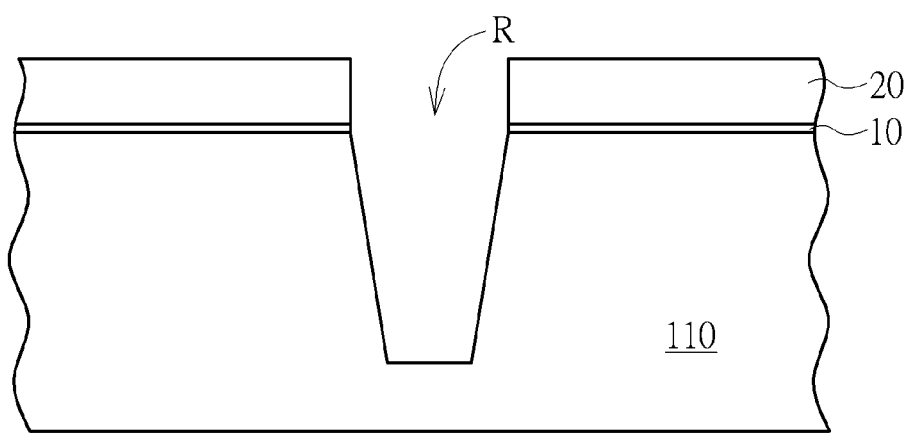
Figure 4:
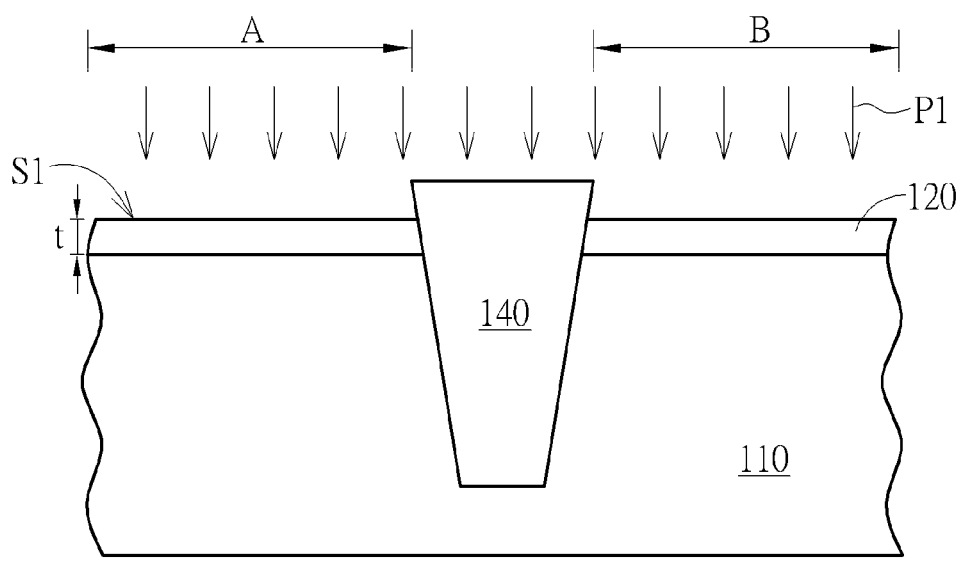

For details of Step S1 in FIG. 1—forming a first oxide layer on a substrate having a first area and a second area—refer to FIGS. 2-4. As shown in FIG. 2, an oxide layer 10 and a nitride layer 20 are sequentially formed on a substrate 110. Then, a lithography process is performed to form a photoresist layer K1 and define an insulating area I. The substrate 110 may be a semiconductor substrate such as a silicon substrate, a silicon-containing substrate, or a silicon-on-insulator (SOI) substrate etc. In this embodiment, the substrate 110 is a silicon substrate, the oxide layer 10 is a pad oxide layer, which may be a silicon dioxide layer, and the nitride layer 20 is a silicon nitride layer, but is not limited thereto.

The nitride layer 20 and the oxide layer 10 are patterned and the substrate 110 is etched to form a trench R by using the photoresist layer K1 as a mask for etching once or a plurality of times, and the photoresist layer K1 is then removed, as shown in FIG. 3. The depth of the trench R may be between 300 nm and 700 nm, depending upon a desired formed structure. A liner (not shown) may be selectively formed on the inner sides of the trench R to eliminate damage caused during etching, wherein the liner may be an oxide layer, and may be formed by methods such as a thermal oxidation method.

An isolation structure (not shown) is filled in the trench R by methods such as chemical vapor deposition (CVD) or high aspect ratio process (HARP). The excess material of the isolation structure (not shown) is removed by applying chemical-mechanical polishing (CMP) and using the nitride layer 20 as a polish stop layer, to form an isolation structure 140 having a flat surface, as shown in FIG. 4. The nitride layer 20 and the oxide layer 10 are then removed by using, for example, hot phosphoric acid and dilute hydrofluoric acid (DHF) for enabling following processes to be performed. Preferably, the oxide layer 10 is removed by performing a dilute hydrofluoric acid process with a processing time larger than 100 seconds, and a standard clean 1 process with a processing time larger than 30 seconds, but this is not limited thereto. The substrate 110 may be further cleaned by sequentially performing an ozone containing process, a dilute hydrofluoric acid process with a processing time larger than 60 seconds, a standard clean 1 process with a processing time larger than 30 seconds, and a standard clean 2 process with a processing time of 40 seconds, but is not limited thereto. In this embodiment, the isolation structure 140 is a shallow trench isolation (STI) structure.

Thereafter, a first oxide layer 120 is formed on the substrate 110 of the first area A as well as the second area B. In this embodiment, the isolation structure 140 protrudes from the substrate 110 and the first oxide layer 120. The first oxide layer 120 may be formed by a thermal oxide process, which preferably has a processing temperature of 1000° C., and the thickness of the first oxide layer 120 is 32 angstroms in this embodiment.

The isolation structure 140 divides the substrate 110 into a plurality of active regions, such as the first area A and the second area B. The first oxide layer 120 is located on the surface of the first area A as well as the second area B. The first area A is a high voltage area while the second area B is a low voltage area. In this embodiment, the first area A is an input/output area while the second area B is a core area, but this is not limited thereto. Moreover, the present invention is applied to form planar components such as planar transistors in this embodiment, but the present invention can also be applied to form non-planar components such as non-planar transistors or fin field-effect transistors (FinFET) in another embodiment, so the substrate 110 may include at least a fin-shaped structure in the first area A or/and the second area B.

For details of Step S2 in FIG. 1—performing an ammonium hydroxide ($NH_4OH$) and hydrogen peroxide ($H_2O_2$) containing process on the first oxide layer of the first area and the second area—refer to FIG. 4. An ammonium hydroxide ($NH_4OH$) and hydrogen peroxide ($H_2O_2$) containing process P1 is performed on the first oxide layer 120 of the first area A and the second area B. Si—O—Si bonds of a surface S1 of the first oxide layer 120 in the first area A and the second area B can be broken and transform into Si—OH bonds, thereby intermixing of the first oxide layer 120 and a later formed dielectric layer having a high dielectric constant and current leakage density ($J_g$) can be improved. In a preferred embodiment, the thickness t of the first oxide layer 120 of the first area A that is removed while the ammonium hydroxide ($NH_4OH$) and hydrogen peroxide ($H_2O_2$) containing process is performed is larger than 0.2 angstroms, in order to reduce current leakage density ($J_g$) efficiently. Preferably, the ammonium hydroxide ($NH_4OH$) and hydrogen peroxide ($H_2O_2$) containing process is a standard clean 1 process that can be integrated with other cleaning processes and simplifying processes. More preferably, the processing temperature of the ammonium hydroxide ($NH_4OH$) and hydrogen peroxide ($H_2O_2$) containing process is in a range of 25° C.~80° C.; and the processing time of the ammonium hydroxide ($NH_4OH$) and hydrogen peroxide ($H_2O_2$) containing process is larger than 30 seconds for fully transforming the Si—O—Si bonds of the surface S1 of the first oxide layer 120 in the first area A and the second area B, especially for the first area A while it is an input/output area.

Figure 5:
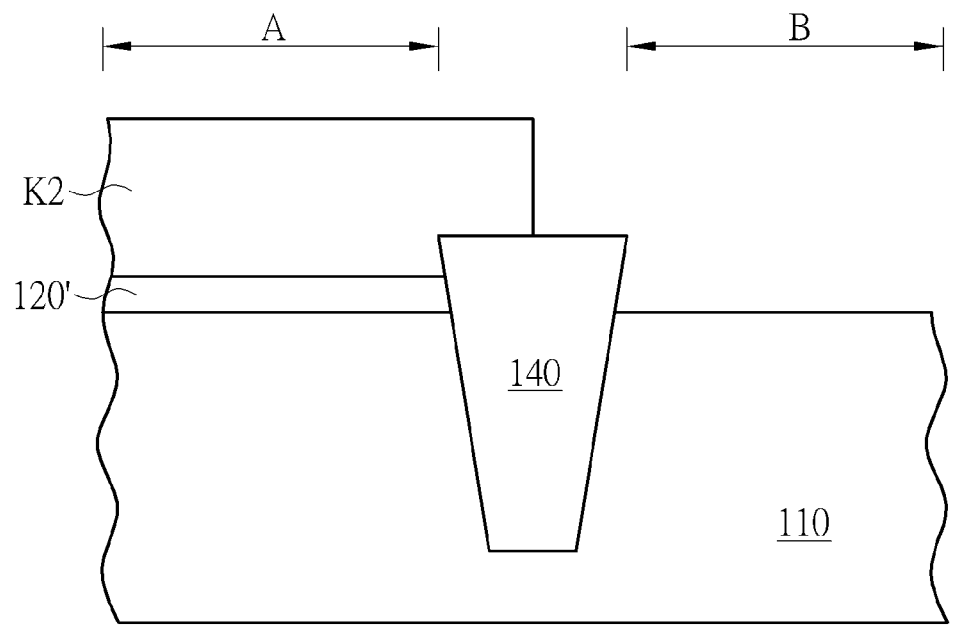

For details of Step S3 in FIG. 1—covering a photoresist layer on the first oxide layer of the first area while exposing the first oxide layer of the second area, and removing the first oxide layer of the second area—please refer to FIG. 5. A photoresist layer K2 covers the first oxide layer 120 of the first area A but exposes the first oxide layer 120 of the second area B. Then, the first oxide layer 120 of the second area B is removed, so that the first oxide layer 120' of the first area A is reserved. In this embodiment, the first oxide layer 120 of the second area B is removed by a dilute hydrofluoric acid (DHF) containing process, but this is not limited thereto. Preferably, the processing time of the dilute hydrofluoric acid (DHF) containing process may be 135 seconds.

Figure 6:
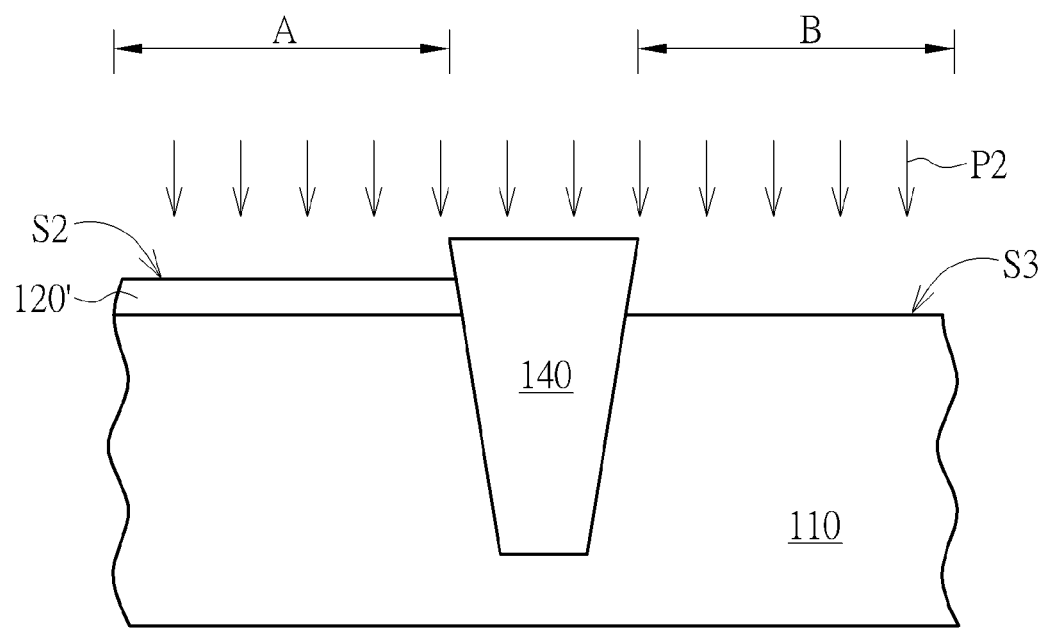

For details of Step S4 in FIG. 1—removing the photoresist layer—please refer to FIG. 6. The photoresist layer K2 is removed. In this embodiment, the photoresist layer is removed by a sulfuric acid ($H_2SO_4$) containing process, but this is not limited thereto. Preferably, the processing time of the sulfuric acid ($H_2SO_4$) containing process may be 60 seconds, but is not limited thereto.

Sequential cleaning processes P2 are optionally performed in the first area A as well as the second area B to clean the residues remaining from previous processes, the residues of the first oxide layer 120 in the second area B and the residues of the photoresist K2. This is illustrated by Step S5 in FIG. 1—performing a standard clean 1 process on the first oxide layer of the first area and the substrate of the second area; performing an ozone containing process on the first oxide layer of the first area and the substrate of the second area; performing a standard clean 1 process on the first oxide layer of the first area and the substrate of the second area; and performing a standard clean 2 process on the first oxide layer of the first area and the substrate of the second area. After the photoresist layer K2 is removed, a standard clean 1 process is optionally performed on the first oxide layer 120' of the first area A and the substrate 110 of the second area B. The standard clean 1 process is preferably performed at room temperature, but is not limited thereto. Then, an ozone containing process on the first oxide layer 120' of the first area A and the substrate 110 of the second area B is performed. Thereafter, a standard clean 1 process and a standard clean 2 process are sequentially performed on the first oxide layer 120' of the first area A and the substrate 110 of the second area B. In a preferred embodiment, the processing temperature of the standard clean 1 process may be 40° C. This means a standard clean 1 process at room temperature, an ozone containing process, a standard clean 1 process and a standard Clean 2 process are sequentially performed in this embodiment, but the type of each above-mentioned cleaning process and the order of these cleaning processes are not restricted thereto. The purpose of these cleaning processes is to clean the impurities and residues on the surface S2 of the first oxide layer 120' in the first area A and the surface S3 of the substrate 110 in the second area B.

Figure 7:
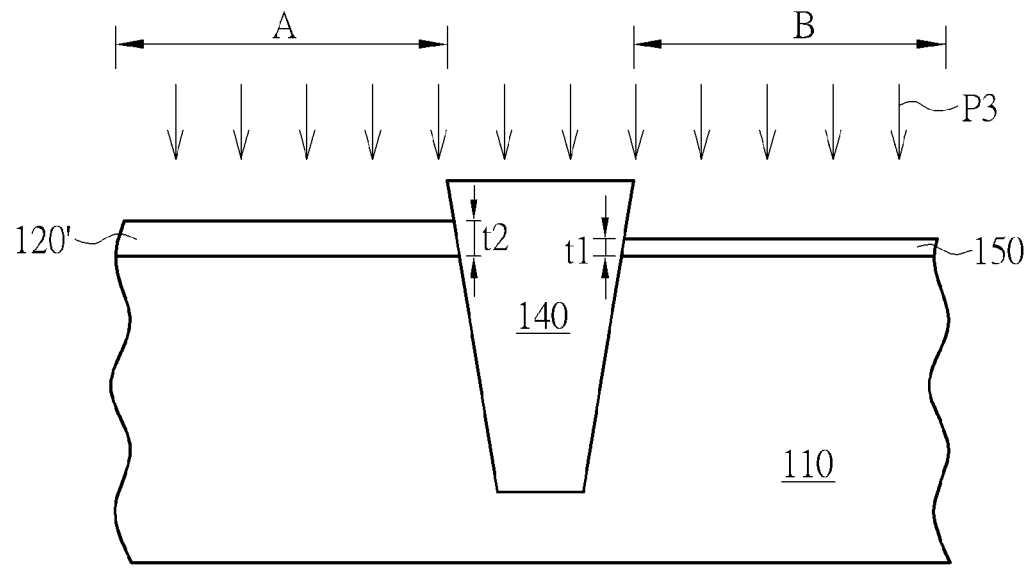

For details of Step S6 in FIG. 1—forming a second oxide layer on the substrate of the second area—please refer to FIG. 7. A second oxide layer 150 is formed on the substrate 110 of the second area B. The second oxide layer 150 is preferably formed by a thermal oxide process to have a densified structure. In an embodiment, the processing temperature of the thermal oxide process is larger than 900° C. More precisely, the second oxide layer 150 may also be formed on the substrate 110 of the first area A when performing the thermal oxide process, but the thickness of the second oxide layer 150 formed in the first area A is much thinner than the thickness of the first oxide layer 120' and thus can be omitted. Due to the first area A serving as an input/output area while the second area B serves as a core area, the thickness t1 of the second oxide layer 150 is thinner than the thickness t2 of the first oxide layer 120'. In one case, the thickness t1 of the second oxide layer 150 may be larger than 7 angstroms, which is much thinner than the thickness t2 of the first oxide layer 120', which approaches 30 angstroms. This is illustrated by Step S7 in FIG. 1—performing a standard clean 1 process on the first oxide layer and the second oxide layer, a standard clean 1 process P3 is performed on the first oxide layer 120' and the second oxide layer 150 to clean residues such as oxides or impurities remaining on the first oxide layer 120' and the second oxide layer 150. Preferably, the processing temperature of the standard clean 1 process is 40° C. and the processing time of the standard clean 1 process may be larger than 30 seconds, but this is not limited thereto. The standard clean 1 process is a light clean (especially compared to the ammonium hydroxide ($NH_4OH$) and hydrogen peroxide ($H_2O_2$) containing process P1), and thus will not damage the second oxide layer 150 or expose the substrate 110 as the second oxide layer 150 is cleaned only slightly.

Figure 8:
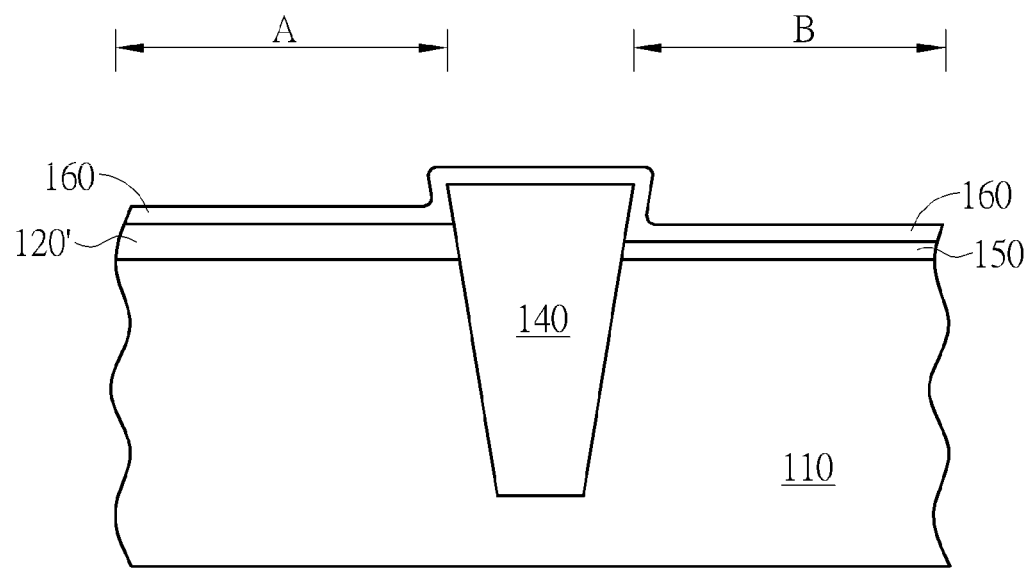

For details of Step S8 in FIG. 1—forming a dielectric layer having a high dielectric constant on the first oxide layer of the first area and the second oxide layer of the second area—please refer to FIG. 8. A dielectric layer 160 is formed on the first oxide layer 120' of the first area A as well as on the second oxide layer 150 of the second area B. In this embodiment, the dielectric layer 160 may be a dielectric layer having a high dielectric constant, and may be a hafnium oxide layer, but is not limited thereto. The dielectric layer having a high dielectric constant may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide (HfZrO4), strontium bismuth tantalite ($SrBi_2Ta_2O_9$, SBT), lead zirconate titanate ($PbZr_xTi_1$-$xO_3$, PZT) and barium strontium titanate ($Ba_xSr_1$-$xTiO_3$, BST).

Thereafter, a gate or a metal gate process may be performed sequentially.

It is emphasized that, since the ammonium hydroxide ($NH_4OH$) and hydrogen peroxide ($H_2O_2$) containing process P1 is performed on the first oxide layer 120 of the first area A and the second area B before covering the photoresist K2 and removing the first oxide layer 120 of the second area B, Si—O—Si bonds of the first oxide layer 120 in the first area A can be broken and transform into Si—OH bonds, thereby improving the interface of the first oxide layer 120 in the first area A and the dielectric layer 160. This leads to better intermixing of the first oxide layer 120 and the dielectric layer 160 and low current leakage density ($J_g$). Meanwhile, due to the ammonium hydroxide ($NH_4OH$) and hydrogen peroxide ($H_2O_2$) containing process P1 being performed on the first oxide layer 120 of the second area B without being performed on the second oxide layer 150 of the second area B, the ammonium hydroxide ($NH_4OH$) and hydrogen peroxide ($H_2O_2$) containing process P1 will not damage or change the properties of the substrate 110 of the second area B because of the thick thickness of the first oxide layer 120 and the later formed second oxide layer 150 in the second area B. Therefore, negative bias temperature instability (NBTI) and electrical mobility of a later formed component such as a transistor in the second area B can be maintained.

To summarize, the present invention provides a cleaning process for oxide, which performs an ammonium hydroxide ($NH_4OH$) and hydrogen peroxide ($H_2O_2$) containing process on the first oxide layer of the second area as well as the first area, before covering the photoresist layer or forming the second oxide layer. Hence, the interface of the first oxide layer and the dielectric layer having a high dielectric constant in the first area is improved due to Si—O—Si bonds of the first oxide layer in the first area being broken and transforming into Si—OH bonds, leading to better intermixing of the first oxide layer and dielectric layer having a high dielectric constant, and low current leakage density ($J_g$). Good Negative bias temperature instability (NBTI) and electrical mobility of a later formed component such as a transistor in the second area can be maintained because of the substrate and the later formed second oxide layer in the second area are not damaged or changed by the ammonium hydroxide ($NH_4OH$) and hydrogen peroxide ($H_2O_2$) containing process.

Furthermore, the ammonium hydroxide ($NH_4OH$) and hydrogen peroxide ($H_2O_2$) containing process is preferably a standard clean 1 process. More preferably, the processing temperature of the ammonium hydroxide ($NH_4OH$) and hydrogen peroxide ($H_2O_2$) containing process is in a range of 25° C.~80° C.; and the processing time of the ammonium hydroxide ($NH_4OH$) and hydrogen peroxide ($H_2O_2$) containing process is larger than 30 seconds to fully transform the surface of the first oxide layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cleaning process for oxide, comprising:
   providing a substrate having a first area and a second area;
   forming a first oxide layer on the substrate of the first area and the second area;
   performing an ammonium hydroxide (NH4OH) and hydrogen peroxide (H2O2) containing process on the first oxide layer of the first area and the second area;
   after performing the ammonium hydroxide (NH4OH) and hydrogen peroxide (H2O2) containing process, covering a photoresist layer on the first oxide layer of the first area while exposing the first oxide layer of the second area;
   removing the first oxide layer of the second area; and
   removing the photoresist layer.

2. The cleaning process according to claim 1, wherein the first area is an input/output area while the second area is a core area.

3. The cleaning process according to claim 1, wherein the ammonium hydroxide (NH4OH) and hydrogen peroxide (H2O2) containing process comprises a standard clean 1 process.

4. The cleaning process according to claim 1, wherein the processing temperature of the ammonium hydroxide (NH4OH) and hydrogen peroxide (H2O2) containing process is in a range of 25° C.~80° C.

5. The cleaning process according to claim 1, wherein the processing time of the ammonium hydroxide (NH4OH) and hydrogen peroxide (H2O2) containing process is larger than 30 seconds.

6. The cleaning process according to claim 1, wherein the first oxide layer is removed by a dilute hydrofluoric acid (DHF) containing process.

7. The cleaning process according to claim 1, wherein the photoresist layer is removed by a sulfuric acid (H2SO4) containing process.

8. The cleaning process according to claim 1, further comprising:
performing a standard clean 1 process on the first oxide layer of the first area and the substrate of the second area after the photoresist layer is removed.

9. The cleaning process according to claim 8, wherein the standard clean 1 process is performed at room temperature.

10. The cleaning process according to claim 1, further comprising:
performing an ozone containing process on the first oxide layer of the first area and the substrate of the second area after the photoresist layer is removed.

11. The cleaning process according to claim 10, further comprising:
performing a standard clean 1 process on the first oxide layer of the first area and the substrate of the second area after the ozone containing process is performed.

12. The cleaning process according to claim 11, further comprising:
performing a standard clean 2 process on the first oxide layer of the first area and the substrate of the second area after the standard clean 1 process is performed.

13. The cleaning process according to claim 1, further comprising:
forming a second oxide layer on the substrate of the second area after the photoresist layer is removed.

14. The cleaning process according to claim 13, wherein the second oxide layer is formed by a thermal oxide process.

15. The cleaning process according to claim 13, wherein the thickness of the second oxide layer is thinner than the thickness of the first oxide layer.

16. The cleaning process according to claim 13, further comprising:
performing a standard clean 1 process on the first oxide layer and the second oxide layer after the second oxide layer is formed.

17. The cleaning process according to claim 16, wherein the processing temperature of the standard clean 1 process is 40° C.

18. The cleaning process according to claim 16, wherein the processing time of the standard clean 1 process is larger than 30 seconds.

19. The cleaning process according to claim 13, further comprising:
forming a dielectric layer having a high dielectric constant on the first oxide layer of the first area and the second oxide layer of the second area after the second oxide layer is formed.

20. The cleaning process according to claim 19, wherein the dielectric layer having a high dielectric constant comprises a hafnium oxide layer.

\* \* \* \* \*